(12) United States Patent
Bin Che Ani et al.

(10) Patent No.: US 12,069,810 B2
(45) Date of Patent: Aug. 20, 2024

(54) SOLDER PASTE STENCIL WITH APERTURE WALL COATING

(71) Applicant: Western Digital Technologies, Inc., San Jose, CA (US)

(72) Inventors: Fakhrozi Bin Che Ani, Parit Buntar (MY); Mohamad Riduwan Bin Ramli, Began Serai (MY); Mohamad Solehin Bin Mohamed Sunar, Nibong Tebal (MY); Ibrahym Bin Ahmad, Bukit Mertajam (MY)

(73) Assignee: Sandisk Technologies, Inc., Milpitas, CA (US)

( * ) Notice: Subject to any disclaimer, the term of this patent is extended or adjusted under 35 U.S.C. 154(b) by 127 days.

(21) Appl. No.: 17/353,192

(22) Filed: Jun. 21, 2021

(65) Prior Publication Data
US 2022/0159842 A1 May 19, 2022

Related U.S. Application Data

(60) Provisional application No. 63/114,761, filed on Nov. 17, 2020.

(51) Int. Cl.
*H05K 3/12* (2006.01)
*H05K 3/24* (2006.01)
(Continued)

(52) U.S. Cl.
CPC ......... *H05K 3/1225* (2013.01); *H05K 3/1233* (2013.01); *H05K 3/24* (2013.01);
(Continued)

(58) Field of Classification Search
CPC ...... H05K 3/1225; H05K 3/1233; H05K 3/24; H05K 3/3485; H05K 3/282; H05K 3/281;
(Continued)

(56) References Cited

U.S. PATENT DOCUMENTS 10,428,416 B2 10/2019 Moriguchi et al.
2004/0261636 A1* 12/2004 Fleck .................. H05K 3/1225
101/127

(Continued)

FOREIGN PATENT DOCUMENTS

CA 3084321 A1 2/2017
CN 101268724 A 9/2008
(Continued)

OTHER PUBLICATIONS

Kim et al., "Solder printability of a stencil with a hydrophobic organic coating," 2015 IEEE 65th Electronic Components and Technology Conference (ECTC), San Diego, CA, USA, 2015, pp. 225-229. (Year: 2015).*

(Continued)

*Primary Examiner* — A. Dexter Tugbang
(74) *Attorney, Agent, or Firm* — Michael Best & Friedrich LLP

(57) ABSTRACT

A solder paste stencil includes, in one embodiment, a substrate defining solder apertures, each aperture wall of each of the solder apertures is coated with a coating material that reduces wetting of a solder paste relative to the aperture walls.

20 Claims, 6 Drawing Sheets
(5 of 6 Drawing Sheet(s) Filed in Color)

(51) Int. Cl.
*H05K 3/34* (2006.01)
*H05K 1/11* (2006.01)
*H05K 3/28* (2006.01)

(52) U.S. Cl.
CPC .............. *H05K 1/115* (2013.01); *H05K 3/282* (2013.01); *H05K 3/3485* (2020.08); *H05K 2203/0726* (2013.01); *H05K 2203/1366* (2013.01)

(58) Field of Classification Search
CPC ... H05K 2203/0726; H05K 2203/1366; H05K 1/115; C11D 3/373
See application file for complete search history.

(56) References Cited

U.S. PATENT DOCUMENTS

| | | | |
|---|---|---|---|
| 2007/0015310 A1* | 1/2007 | Thompson | H05K 3/1225 257/E21.271 |
| 2010/0004583 A1* | 1/2010 | Panos | H05K 3/282 604/20 |
| 2011/0045238 A1 | 2/2011 | Zeininger et al. | |
| 2014/0248443 A1 | 9/2014 | Eder et al. | |
| 2014/0272148 A1* | 9/2014 | Phang | C11D 3/373 510/182 |
| 2014/0295267 A1 | 10/2014 | Wang | |
| 2015/0050418 A1* | 2/2015 | Greer | H05K 3/1216 427/9 |
| 2016/0060404 A1* | 3/2016 | Lin | H05K 3/281 428/327 |

FOREIGN PATENT DOCUMENTS

| | | |
|---|---|---|
| CN | 202310312 U | 7/2012 |
| CN | 104427774 A | 3/2015 |
| CN | 102610579 B | 8/2016 |
| CN | 104427774 B | 4/2018 |
| JP | 2014065256 A * | 4/2014 |

OTHER PUBLICATIONS

Chai Chunpeng et al., "Polymer Synthetic Materials Science", Beijing Institute of Technology Press, Jan. 2019, pp. 267-269.

Yucheng, Z., et al., "Hydrophobic Materials", Bureau of Energy, Ministry of Economic Affairs, May 5, 2011, https://magazine.twenergy.org.tw/Cont.aspx? CatID=&ContID=1830 full text.

Maoxun, L., "Research on micro-liquid filling of elliptical micro mold cavities", A Thesis Submitted to Institute of Mechanical Engineering College of Engineering National Chiao Tung University in Partial Fulfillment of The Requirements for the Degree of Master of Science in Mechanical Engineering Jul. 2006.

Junying, Z., "Polydimethylsiloxane", Science, Online Sep. 23, 2010, https://highscope.ch.ntu.edu.tw/wordpress/?p=8617 full text.

Online Literature, Unnamed Polyorganosiloxane, Chinese Encyclopedia https://www.newton.com.tw/wiki/Polyorganosiloxane/3675973 full text.

Pengcang, S., "Is polysiloxane an organic substance or is it Is it an inorganic coating?" Jiang body coating, Jan. 22, 2015 https://www.j-coating.com.tw/motion.asp?siteid=1006082&menuid=34737&postid=677199 full text.

Phan, H.T., "Effects of Nano- and Micro-surface Treatments on Boiling Heat Transfer", INPG Electric Power, Institut National Polytechnique de Grenoble, 2010 Table 2-4, pp. 1-174.

"Silicone resin," Wikipedia, Retrieved from Internet URL:https://en.wikipedia.org/wiki/Silicone_resin, last edited on Oct. 21, 2023, pp. 2 (Jun. 4, 2023).

* cited by examiner

RELATED ART

| Stencil Characteristic | | | | Quality Characteristic / Measurement Method | | Result | |
|---|---|---|---|---|---|---|---|
| Stencil material | Cutting method | Coating | Area ratio (l/2t) | Yield loss due to solder bridging (Ideal value: 0%) | Solder Paste Printing CPK (Ideal value: >2) / SPI | | Decision |
| Stainless Steel | Laser Cut | None | 0.75 | Fail (0.106%) | Meet | Not statistically better | Reject |
| Nickel blank | Electroforming | None | 0.52 | Pass (0.00%) | Not Meet | Not statistically better | Reject |
| Nickel blank | Electroforming | Nano-coat by PVD | 0.52 | Pass (0.00%) | Meet | Statistically better | Accept |

SOLDER PASTE STENCIL WITH APERTURE WALL COATING

CROSS-REFERENCE TO RELATED APPLICATION

This application claims priority to and the benefit of U.S. Provisional Patent Application No. 63/114,761, filed on Nov. 17, 2020, the entire contents of which is incorporated herein by reference.

BACKGROUND

This application relates generally to a solder paste stencil and, more particularly, to a solder paste stencil with an aperture wall coating.

FIG. 1 is an X-ray laminography image 100 illustrating solder bridging examples 102 and 104. As illustrated in FIG. 1, solder bridging of a fine pitch ball grid array (BGA) is a common issue in the surface-mount technology (SMT) process. Several conventional techniques have been developed to overcome the issue of solder bridging. One of the conventional techniques is reducing a size of each aperture in the solder stencil to reduce the volume of the solder paste during the solder printing process.

According to the solder stencil design guidelines, the area ratio for a fine pitch BGA (0.4 mm) should be in the range of 0.56 to 0.75. However, a stable solder printing process could not be established using the above parameter because of an insufficient amount of deposited solder paste and aperture clogging. FIG. 2 is an image 200 illustrating an example 202 of the insufficient amount of deposited solder paste. FIG. 3 is an image 300 illustrating an example 302 of aperture clogging. Consequently, reducing the size of each aperture in the solder stencil results in poor solder paste release during the solder printing process and the solder printing process results in solder defects.

SUMMARY

To overcome the insufficient amount of deposited solder paste and aperture clogging, a smooth stencil aperture wall is needed to improve the solder paste release capability of the solder paste stencil. FIG. 4 is a scanning electron microscopy (SEM) image 400 illustrating a rough aperture wall 402 of a solder paste stencil.

Several coating techniques for the aperture walls of the solder paste stencil were developed. For example, a first coating technique is a wipe-on coating technique and a second coating technique is a spray deposition technique. However, these two techniques did not ensure maximum coverage on the aperture walls especially for fine pitch apertures.

To ensure maximum coverage on the aperture walls, especially for fine pitch apertures, a precise nano-coating via physical vapor deposition (PVD) was developed to improve the solder paste release capability of the solder paste stencil. The advantage of the PVD nano-coating is the ability to completely cover the surface of the aperture walls.

The disclosure provides a substrate defining a plurality of solder apertures, each aperture wall of each of the plurality of solder apertures is coated with a coating material that reduces the wetting of a solder paste relative to the stencil aperture walls.

The disclosure provides a method for manufacturing a solder paste stencil. The method includes cutting a substrate to define a plurality of solder apertures. The method also includes depositing a coating material on each aperture wall of each of the plurality of solder apertures, the coating material reduces wetting of a solder paste relative to the each aperture wall.

The disclosure also provides a method for performing surface-mount soldering. The method includes applying solder material to a substrate defining a plurality of solder apertures, each aperture wall of each of the plurality of solder apertures is coated with a coating material that reduces wetting of a solder paste relative to the each aperture wall. The method also includes depositing, with the substrate, the solder material onto a printed circuit board.

In this manner, various aspects of the disclosure provide for improvements in at least the technical fields of solder paste stencils and manufacturing with solder paste stencils. The foregoing introduction is intended solely to give a general idea of various aspects of the disclosure and does not limit the scope of the disclosure in any way.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 8 is a table illustrating decision matrix of different solder paste stencils, in accordance with some embodiments of the disclosure.

DETAILED DESCRIPTION

Figure 1:
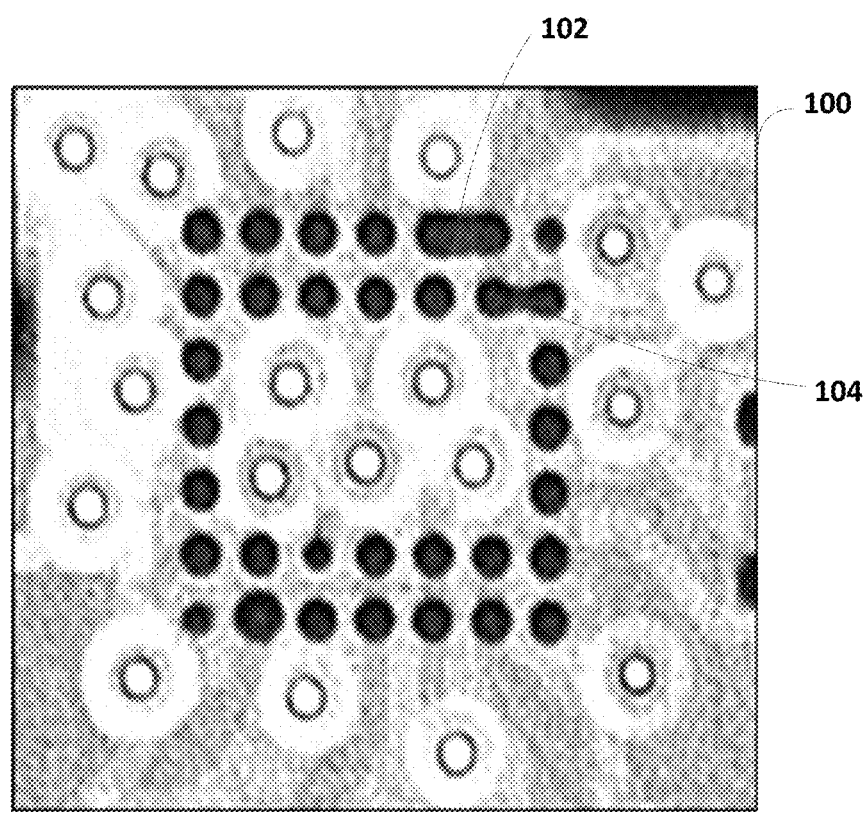
FIG. 1 is an X-ray laminography image illustrating solder bridging examples.
Figure 2:
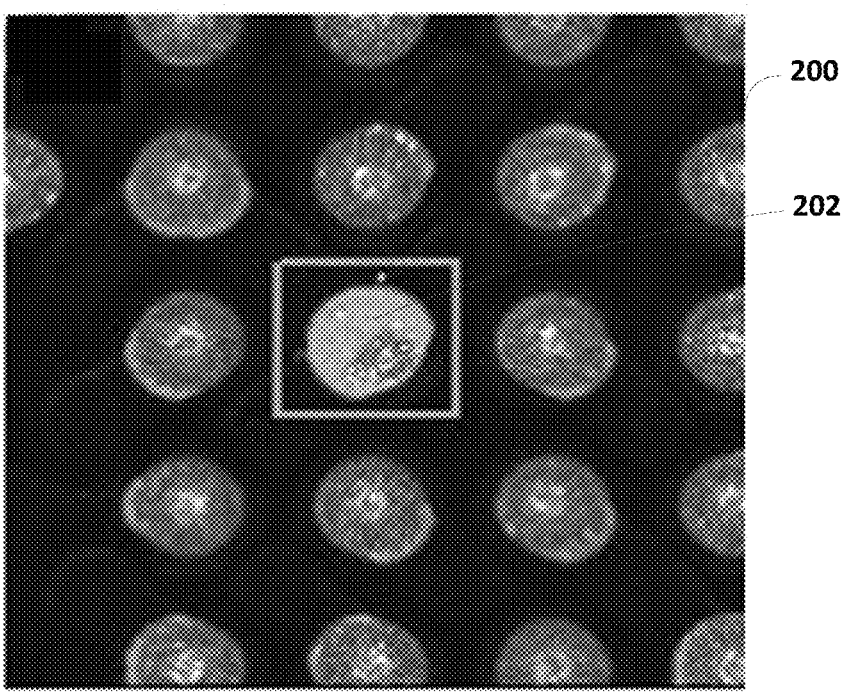
FIG. 2 is an image illustrating an example of the insufficient amount of deposited solder paste.
Figure 3:
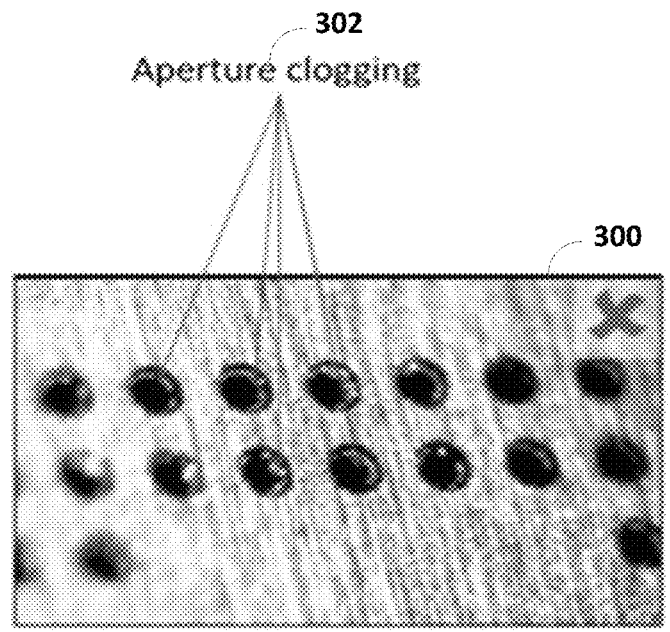
FIG. 3 is an image illustrating an example of aperture clogging.
Figure 4:
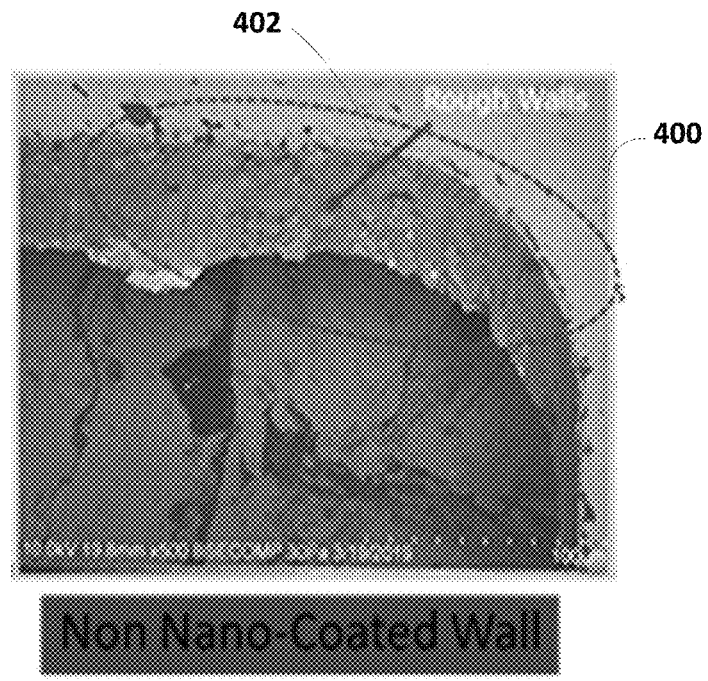
FIG. 4 is a scanning electron microscopy (SEM) image illustrating a rough aperture wall of a solder paste stencil.
Figure 5:
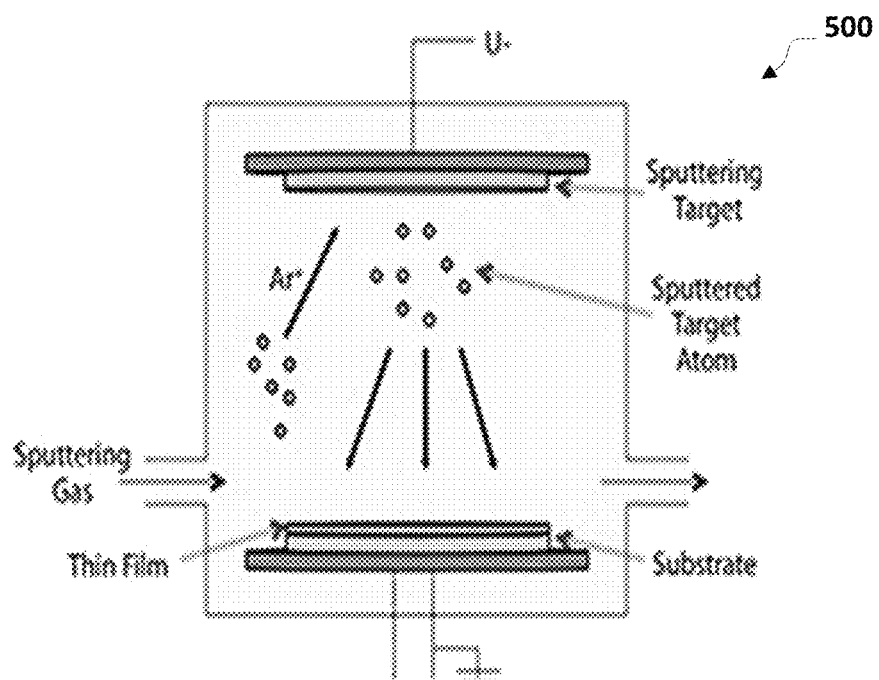
FIG. 5 is a schematic diagram illustrating a PVD coating process using a sputtering technique to coat an aperture wall of a solder paste stencil with a coating material, in accordance with some embodiments of the disclosure.

FIG. 5 is a schematic diagram illustrating a PVD coating process 500 using a sputtering technique to coat an aperture wall of a solder paste stencil with a coating material, in accordance with some embodiments of the disclosure. The PVD coating process 500 refers to a variety of thin film deposition techniques that vaporize a solid material in a vacuum environment and deposit the solid material on substrates as a pure material or an alloy composition coating. As the PVD coating process 500 transfers the coating material as a single atom or on the molecular level, the PVD coating process provides extremely pure and high performance coatings.

Conventional uses of a PVD coating are basically concerned with surface protection, optical application, and surface treatment on medical devices or semiconductor devices. Unlike the conventional uses of the PVD coating, the PVD coating process 500 in the present disclosure is an application of a PVD coating to enhance the smoothness of a solder paste stencil aperture wall in the SMT manufacturing process and to improve the solder paste release capability of the solder paste stencil. In some examples, the PVD coating is a PVD nano-coating of a silicone material or other suitable vapor deposition material that reduces wetting of a solder paste relative to the stencil aperture walls (substrate).

As illustrating FIG. 5, during the PVD coating process 500, the coating material (e.g., a silicone material) is gasified to ions and deposited onto the surface of substrate (i.e., the solder paste stencil) by application of potential bias. The PVD coating process 500 creates an atom-by-atom deposition and promotes higher nano-coating coverage as well as a stronger coating structure, which translates to superior hydrophobicity (to reduce wetting) and longer coating lifespan.

Figure 6:
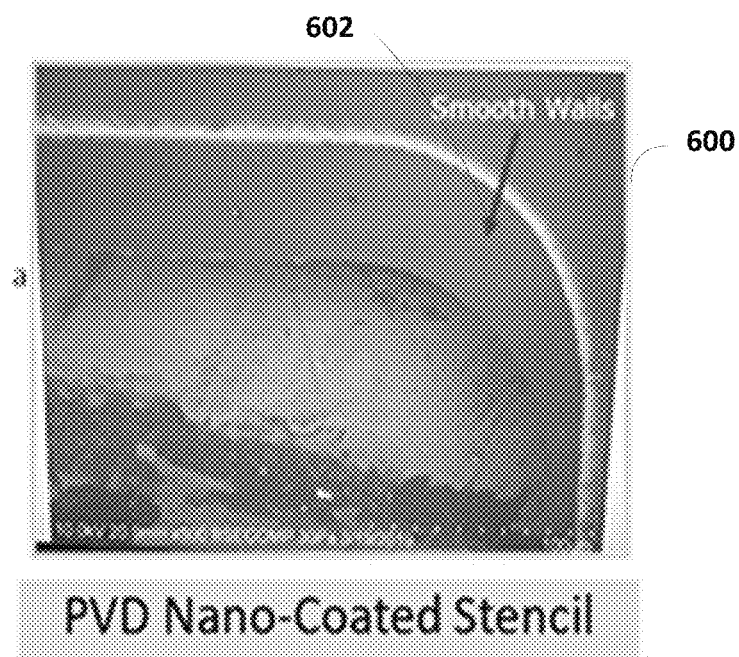
FIG. 6 is a scanning electron microscopy (SEM) image illustrating a smooth aperture wall of a solder paste stencil that has been coated with a silicon material from PVD coating process of FIG. 5, in accordance with some embodiments of the disclosure.

FIG. 6 is a scanning electron microscopy (SEM) image 600 illustrating a smooth aperture wall 602 of a solder paste stencil that has been coated with a silicone material from the PVD coating process 500 of FIG. 5, in accordance with some embodiments of the disclosure.

Figure 7:
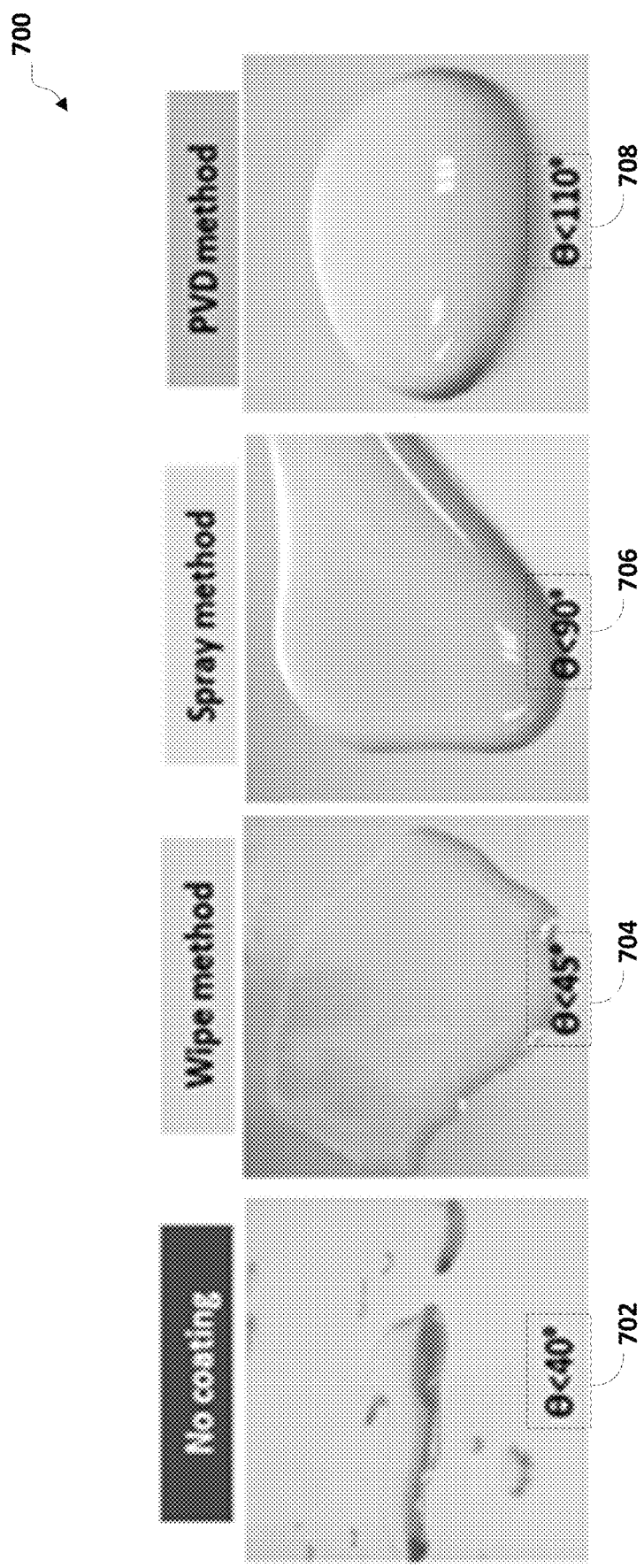
FIG. 7 is a diagram illustrating a comparison of a water contact angle of different coating techniques after 1000 printing cycles, in accordance with some embodiments of the disclosure.

FIG. 7 is a diagram illustrating a comparison 700 of a water contact angle of different coating techniques after 1000 solder printing cycles, in accordance with some embodiments of the disclosure. As illustrated in FIG. 7, the comparison 700 includes a first water contact angle 702 associated with no coating, a second water contact angle 704 associated with a wipe method, a third water contact angle 706 associated with a spray method, and a fourth water contact angle 708 associated with the PVD method. The first water contact angle 702 may be thirty-nine degrees or less. The second water contact angle 704 may be forty-four degrees or less. The third water contact angle 706 may be eighty-nine degrees or less. The fourth water contact angle 708 may be one-hundred and nine degrees or less.

As illustrated in FIG. 7, the fourth water contact angle 708 may be a higher angle than the first water contact angle 702, the second water contact angle 704, and the third water contact angle 706. Consequently, the fourth water contact angle 708 associated with the PVD method has the highest hydrophobicity versus the hydrophobicity of the other coating methods, which means a solder paste stencil coated with the PVD method will have the lowest wettability relative to the other coating methods.

FIG. 8 is a table illustrating decision matrix 800 of different solder paste stencils 802-806, in accordance with some embodiments of the disclosure. As illustrated in the FIG. 8, the decision matrix 800 includes a first solder paste stencil 802, a second solder paste stencil 804, and a third solder paste stencil 806.

The first solder paste stencil 802 has a stencil material of stainless steel and is laser cut. The first solder paste stencil 802 does not have a coating. The first solder paste stencil 802 also has an area ratio (r/2 T) of 0.75. However, the first solder paste stencil 802 causes solder bridging while meeting the solder paste printing Cpk (Process Capability Index).

The second solder paste stencil 804 has a stencil material of nickel and is cut with electroforming. The second solder paste stencil 804 does not have a coating. The second solder paste stencil 804 also has an area ratio (r/2 T) of 0.52. However, while the second solder paste stencil 804 does not cause solder bridging, the second solder paste stencil 804 does not meet the greater than two value of the solder paste printing Cpk.

The third solder paste stencil 806 has a stencil material of nickel and is cut with electroforming. The third solder paste stencil 806 has a nano-coat provide by PVD (e.g., the PVD coating process 500 described above in FIG. 5). The third solder paste stencil 806 also has an area ratio (r/2 T) of 0.52. Unlike the first solder paste stencil 802 and the second solder paste stencil 804, the third solder paste stencil 806 does not cause solder bridging and does meet the greater than two value of the solder paste printing Cpk. Consequently, the third solder paste stencil 806 is statistically better than conventional solder stencils and does not cause solder bridging.

Figure 9:
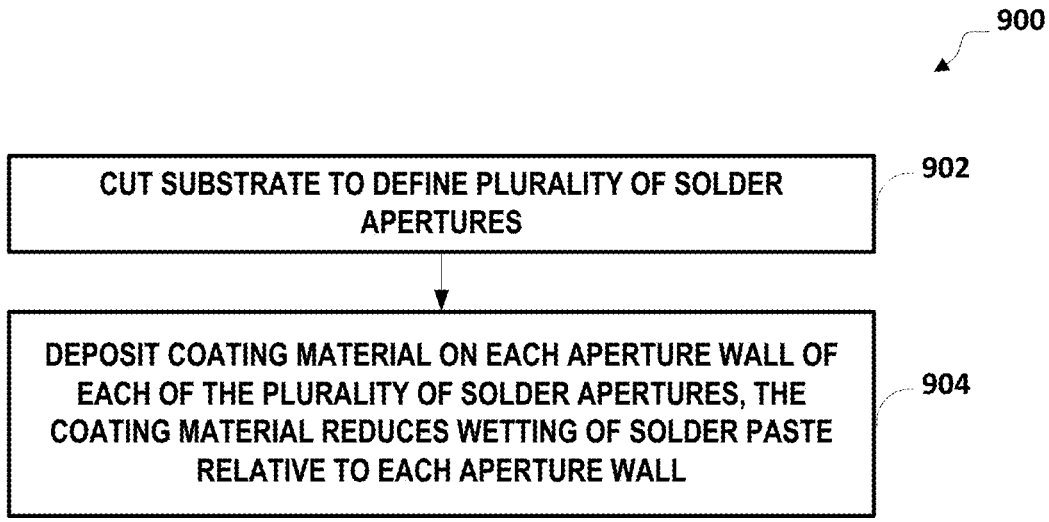
FIG. 9 is a flowchart illustrating a method for manufacturing a solder paste stencil, in accordance with some embodiments of the disclosure.

FIG. 9 is a flowchart illustrating a method 900 for manufacturing a solder paste stencil, in accordance with some embodiments of the disclosure. The method 900 includes cutting a substrate to define a plurality of solder apertures (at block 902). The method 900 also includes depositing a coating material on each aperture wall of each of the plurality of solder apertures, the coating material reduces wetting of a solder paste relative to the each aperture wall (at block 904).

Figure 10:
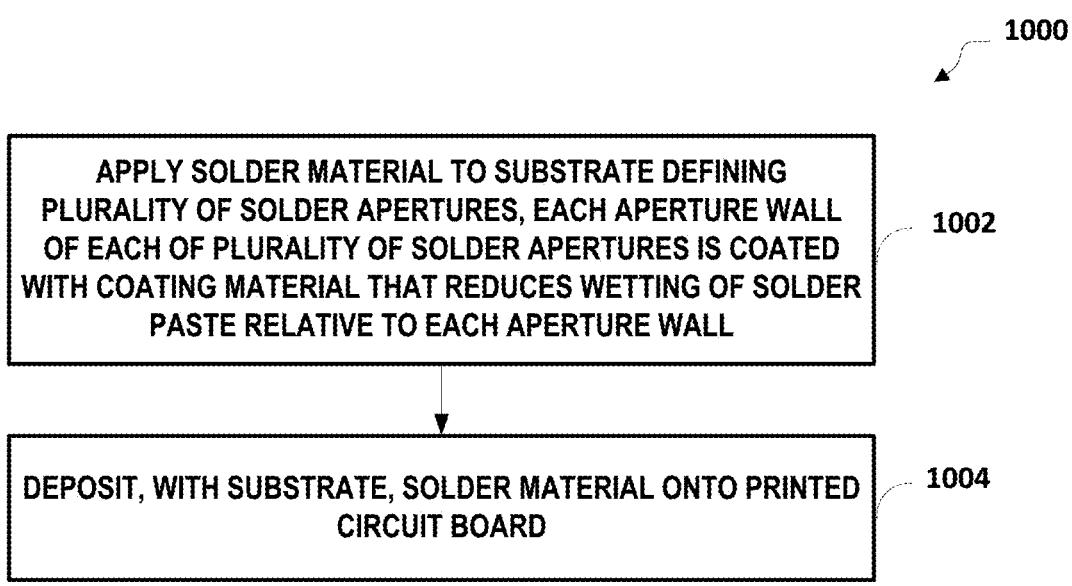
FIG. 10 is a flowchart a method for performing surface-mount soldering, in accordance with some embodiments of the disclosure.

FIG. 10 is a flowchart a method 1000 for performing surface-mount soldering, in accordance with some embodiments of the disclosure. The method 1000 includes applying solder material to a substrate defining a plurality of solder apertures, each aperture wall of each of the plurality of solder apertures is coated with a coating material that reduces wetting of a solder paste relative to the each aperture wall (at block 1002). The method 1000 also includes depositing, with the substrate, the solder material onto a printed circuit board (at block 1004).

In the above description, numerous details are set forth, such as coating methods and a solder paste stencil with a PVD coating, and the like, in order to provide an understanding of one or more aspects of the present disclosure. It will be readily apparent to one skilled in the art that these specific details are merely exemplary and not intended to limit the scope of this application. This description is intended solely to give a general idea of various aspects of the disclosure and does not limit the scope of the disclosure in any way.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claim is hereby incorporated into the Detailed Description and standing on its own as a separately claimed subject matter.

What is claimed is:

1. A surface mount technology (SMT) solder paste stencil, comprising:
   a substrate defining a plurality of solder apertures, each aperture wall of each of the plurality of solder apertures is coated with a coating material that enhances a smoothness of the each aperture wall in a SMT process and reduces wetting of a solder paste relative to the each aperture wall,
   wherein the coating material has a first water contact angle greater than a second water contact angle of the substrate without the coating material,
   wherein the coating material is a silicone material,
   wherein the first water contact angle is greater than thirty-nine degrees and less than one hundred and ten degrees, and
   wherein second water contact angle is thirty-nine degrees or less.

2. The SMT solder paste stencil of claim 1, wherein the substrate is a nickel material, and wherein the plurality of solder apertures are cut with electroforming.

3. The SMT solder paste stencil of claim 1, wherein the coating material is deposited with one technique selected from a group consisting of:
   physical vapor deposition (PVD),
   a wipe method, and
   a spray method.

4. The SMT solder paste stencil of claim 3, wherein, when the coating material is deposited with the physical vapor deposition (PVD), the coating material meets a greater than two value of a solder paste printing process capability index (Cpk).

5. The SMT solder paste stencil of claim 3, wherein the first water contact angle associated with the PVD is one hundred and nine degrees or less, wherein the first water contact angle associated with the spray method is eighty-nine degrees or less, and wherein the first water contact angle associated with the wipe method is forty-four degrees or less.

6. The SMT solder paste stencil of claim 1, wherein a portion of the each aperture wall of the each of the plurality of solder apertures has a nano-coating of the coating material.

7. The SMT solder paste stencil of claim 6, wherein the portion is all of the each aperture wall.

8. A method for manufacturing a surface mount technology (SMT) solder paste stencil, the method comprising:
   cutting a substrate to define a plurality of solder apertures; and
   depositing a coating material on each aperture wall of each of the plurality of solder apertures, the coating material enhances a smoothness of the each aperture wall in a SMT process and reduces wetting of a solder paste relative to the each aperture wall, wherein the coating material has a first water contact angle greater than a second water contact angle of the substrate without the coating material,
   wherein the coating material is a silicone material,
   wherein the first water contact angle is greater than thirty-nine degrees and less than one hundred and ten degrees, and
   wherein the second water contact angle is thirty-nine degrees or less.

9. The method of claim 8, wherein the substrate is a nickel material, and wherein the plurality of solder apertures are cut with electroforming.

10. The method of claim 8, wherein depositing the coating material on the each aperture wall of the each of the plurality of solder apertures further includes depositing the coating material on the each aperture wall of the each of the plurality of solder apertures with one technique selected from a group consisting of:
    physical vapor deposition (PVD),
    a wipe method, and
    a spray method.

11. The method of claim 10, wherein, when the coating material is deposited with the physical vapor deposition (PVD), the coating material meets a greater than two value of a solder paste printing process capability index (Cpk).

12. The method of claim 10, wherein the first water contact angle associated with the PVD is one hundred and nine degrees or less, wherein the first water contact angle associated with the spray method is eighty-nine degrees or less, and wherein the first water contact angle associated with the wipe method is forty-four degrees or less.

13. The method of claim 8, wherein a portion of the each aperture wall of the each of the plurality of solder apertures has a nano-coating of the coating material.

14. The method of claim 13, wherein the portion is all of the each aperture wall.

15. A method for performing surface-mount soldering, the method comprising:
    applying solder material to a substrate defining a plurality of solder apertures, each aperture wall of each of the plurality of solder apertures is coated with a coating material that enhances a smoothness of the each aperture wall in a surface mount technology (SMT) process and reduces wetting of a solder paste relative to the each aperture wall, wherein the coating material has a first water contact angle greater than a second water contact angle of the substrate without the coating material; and
    depositing, with the substrate, the solder material onto a printed circuit board,
    wherein the coating material is a silicone material,
    wherein the first water contact angle is greater than thirty-nine degrees and less than one hundred and ten degrees, and
    wherein the second water contact angle is thirty-nine degrees or less.

16. The method of claim 15, wherein the substrate is a nickel material, and wherein the plurality of solder apertures are cut with electroforming.

17. The method of claim 15, wherein the coating material is deposited with one technique selected from a group consisting of:
    physical vapor deposition (PVD),
    a wipe method, and
    a spray method.

18. The method of claim 17, wherein the first water contact angle associated with the PVD is one hundred and nine degrees or less, wherein the first water contact angle associated with the spray method is eighty-nine degrees or less, and wherein the first water contact angle associated with the wipe method is forty-four degrees or less.

19. The method of claim 15, wherein a portion of the each aperture wall of the each of the plurality of solder apertures has a nano-coating of the coating material.

20. The method of claim 19, wherein the portion is all of the each aperture wall.

* * * * *